United States Patent [19]

Sueri et al.

[11] Patent Number: 5,986,411
[45] Date of Patent: Nov. 16, 1999

[54] IC FOR IMPLEMENTING THE FUNCTION OF A DIAC DIODE

[75] Inventors: Stefano Sueri, Catania; Atanasio La Barbera, Palermo; Natale Aiello, Catania; Vito Graziano, Palermo, all of Italy

[73] Assignee: SGS-Thomson Microelectronics S.r.l., Agrate Brianza, Italy

[21] Appl. No.: 09/021,289

[22] Filed: Feb. 10, 1998

[30] Foreign Application Priority Data

Feb. 11, 1997 [EP] European Pat. Off. .............. 97830048

[51] Int. Cl.⁶ ..................................... H05B 37/02
[52] U.S. Cl. .......................... 315/226; 315/291; 315/307; 315/DIG. 7; 327/103; 327/108
[58] Field of Search ..................... 315/226, 291, 315/307, 127, DIG. 5, DIG. 7; 327/103, 108, 110, 131, 409, 412, 423; 323/325

[56] References Cited

U.S. PATENT DOCUMENTS

| | | | |
|---|---|---|---|
| 3,772,470 | 11/1973 | Cowpland et al. | 179/84 T |
| 4,047,054 | 9/1977 | Ahmed | 327/381 |
| 4,053,796 | 10/1977 | Plassche | 327/104 |
| 4,184,087 | 1/1980 | Nutz | 307/360 |
| 4,350,949 | 9/1982 | Fujita | 323/284 |
| 4,525,638 | 6/1985 | Gray | 307/350 |
| 5,049,790 | 9/1991 | Herfurth et al. | 315/291 |
| 5,642,065 | 6/1997 | Choi et al. | 327/110 |

FOREIGN PATENT DOCUMENTS 0 740 491  10/1996  European Pat. Off. .
WO-A-89 00360  1/1989  WIPO .

*Primary Examiner*—Haissa Philogene
*Attorney, Agent, or Firm*—Wolf, Greenfield & Sacks, P.C.

[57] ABSTRACT

The present invention relates to an integrated circuit adapted to perform the function of a diode of the DIAC type, the circuit having an input terminal and an output terminal. The circuit includes a first input transistor having a first terminal connected to a fixed voltage reference, a second terminal, and a control terminal coupled to the input terminal of the circuit. The circuit further includes second and third transistors in a current mirror configuration, each having a first terminal for coupling to the input terminal of the circuit, and a second terminal, and associated control terminals connected together and coupled to the second terminal of the first input transistor, the second terminal of the second transistor being connected to the control terminal of the first transistor. Finally, the circuit includes a fourth output transistor connected, with first and second terminals, between the output terminal and the input terminal of the circuit, the fourth output transistor also having a control terminal connected to the second terminal of the third transistor.

30 Claims, 2 Drawing Sheets

IC FOR IMPLEMENTING THE FUNCTION OF A DIAC DIODE

BACKGROUND OF THE INVENTION

1. Field of the Invention

This invention relates to an integrated circuit adapted to perform the function of a DIAC diode.

2. Discussion of the Related Art

As is known, there are many applications, especially where oscillations are required to be triggered in a system of the oscillating type (e.g. an auto-oscillating half-bridge system for so-called "lighting" applications), for which diodes of the DIAC (Diode Alternate Current) type are useful. These diodes are multi-junction bipolar devices, e.g. of the NPNPN type, which are used in applications either as discrete components or integrated components.

Current integration technologies for electronic devices have, however, a disadvantage in that they do not allow of a simple and inexpensive integration of DIACs. As applied to oscillating systems, the DIAC has to produce a pulse for triggering the system oscillations, which then deactivates itself.

Referring to FIG. 1, which shows a graph of a voltage-current characteristic of a diode of the DIAC type, it can be seen that this diode has a very high impedance until the value of a voltage Vd thereacross attains the value of a predetermined diode-triggering voltage indicated at V1 in FIG. 1. Upon the voltage Vd reaching the triggering voltage V1, the diode becomes conductive and behaves almost as a short circuit, the current through it being only limited by its intrinsic resistance.

Again with reference to FIG. 1, it can be seen that as the value of the voltage Vd drops below the value of a so-called sustaining voltage, indicated at Vs on the graph, the diode is no longer conductive and reverts to a condition of high impedance.

Shown in FIG. 3 is an example of application of a diode of the DIAC type to an electronic device for driving a fluorescent lamp. This device, known to the skilled in the art as the "lamp ballast", is an auto-oscillating half-bridge device.

Referring to FIG. 3, the electronic device, indicated at OSC, comprises a transformer having a primary winding P connected in series to a fluorescent lamp TUBE, an inductive load L, and a first capacitor C1. The device OSC further comprises first SW1 and second SW2 switches connected in series between first and second terminal of a supply voltage generator Vr. The two switches SW1 and SW2 are connected in series together through a first intermediate node A. The first switch SW1 and the second switch SW2 are also connected in parallel respectively to first S1 and second S2 secondary winding of the transformer.

The device OSC further comprises a trigger circuit INN including first R1 and second C2 circuit elements which consist of a resistor R1 and a second capacitor C2, respectively, connected in series between the first and second terminals of the supply voltage generator Vr. The resistor R1 and second capacitor C2 are connected in series together through a second intermediate node B. The trigger circuit INN also comprises a first diode D1 of the DIAC type having a first terminal connected to the second intermediate node B and a second terminal connected to the switch SW2 to perform a triggering function for the oscillations of the device OSC. A second diode D2, connected with first and second terminals to the first A and second B intermediate nodes, respectively, functions to disable the first diode D1.

In practice, the device OSC is triggered by the first diode D1 receiving a current from the series connection of the second capacitor C2 and the resistor R1, and produces a first pulse which is received by the switch SW2.

SUMMARY OF THE INVENTION

The underlying technical problem addressed by the present invention is the problem of providing an integrated circuit which has such structural and operational features as to provide the function of a diode of the DIAC type. Thus, the DIAC may be more easily integrated at a greatly reduced integration cost, since the inventive circuit comprises standard circuit elements (transistors, resistive elements, Zener-type diodes), all of which can be easily integrated with current technologies.

According to one embodiment of the present invention, an integrated circuit adapted to perform the function of a diode of the DIAC type is disclosed. The circuit has a first input terminal and a first output terminal and comprises a first input transistor having a first terminal connected to a fixed voltage reference, a second terminal, and one control terminal coupled to the first input terminal of the circuit, second and third transistors in a current mirror configuration, each having a first terminal for coupling to the first input terminal of the circuit, and a second terminal, and associated control terminals connected together and coupled to the second terminal of the first input transistor, the second terminal of the second transistor being connected to the control terminal of the first transistor and a fourth output transistor connected, with first and second terminals, between the first output terminal and the first input terminal of the circuit, the fourth output transistor also having at least one control terminal connected to the second terminal of the third transistor.

According to another embodiment of the invention, an integrated circuit is disclosed comprising a first switch having a first terminal connected to a voltage reference, a second terminal and a third terminal coupled to an input terminal of said circuit through a diode and to its own first terminal through a resistor, a second switch having a first terminal coupled to said input terminal, a second terminal connected to said third terminal of said first switch means and a third terminal coupled to said second terminal of said first switch means, a third switch having a first terminal coupled to said input terminal, a second terminal and a third terminal connected to said third terminal of said second switch means and a fourth switch having a first terminal connected to an output terminal of said circuit, a second terminal connected to said input terminal and a third terminal connected to said second terminal of said third switch means.

The features and advantages of an integrated circuit according to the invention will be apparent from the following description of an embodiment thereof, given by way of non-limitative example with reference to the accompanying drawings.

DETAILED DESCRIPTION

Figure 1:
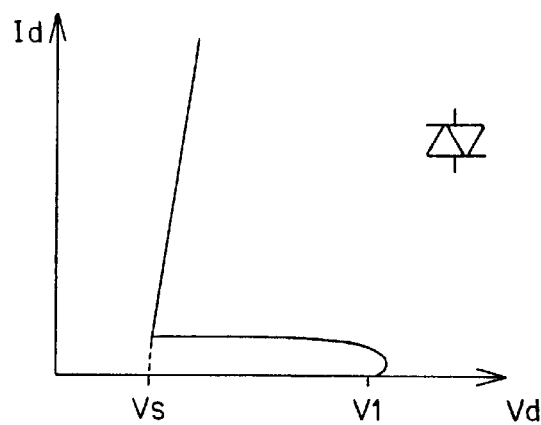
FIG. 1 is a graph of the voltage-current characteristic of a diode of the DIAC type.
Figure 2:
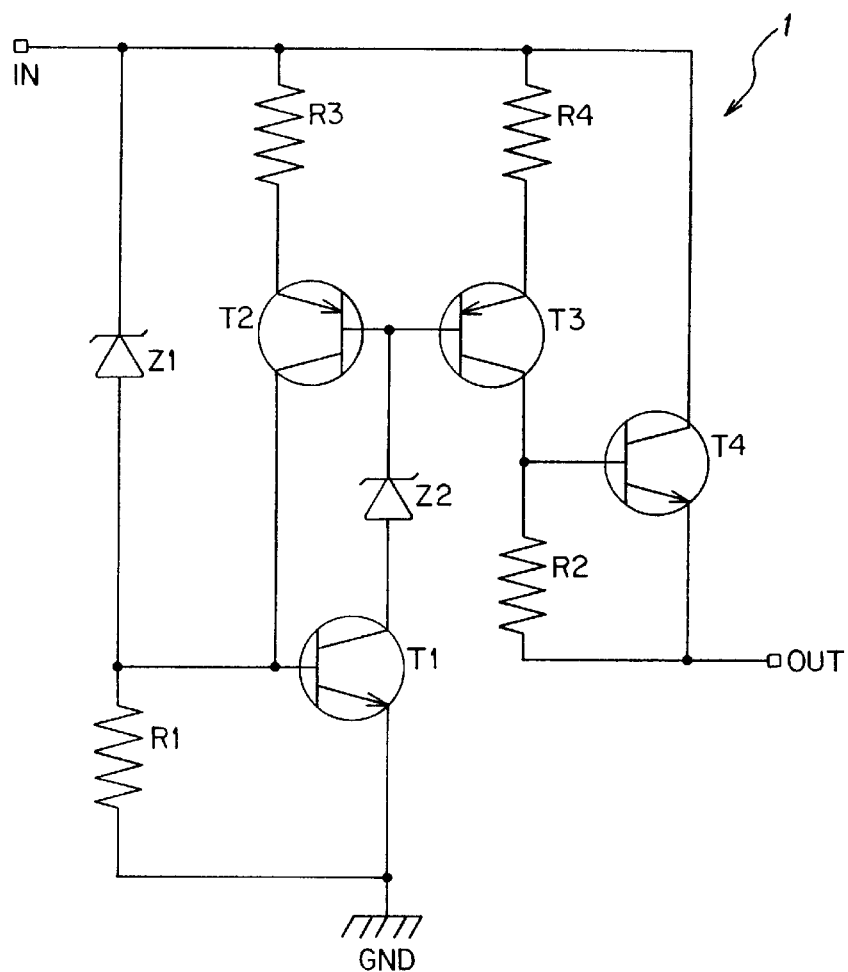
FIG. 2 shows an integrated circuit according to the invention for providing the function of a diode of the DIAC type.
Figure 3:
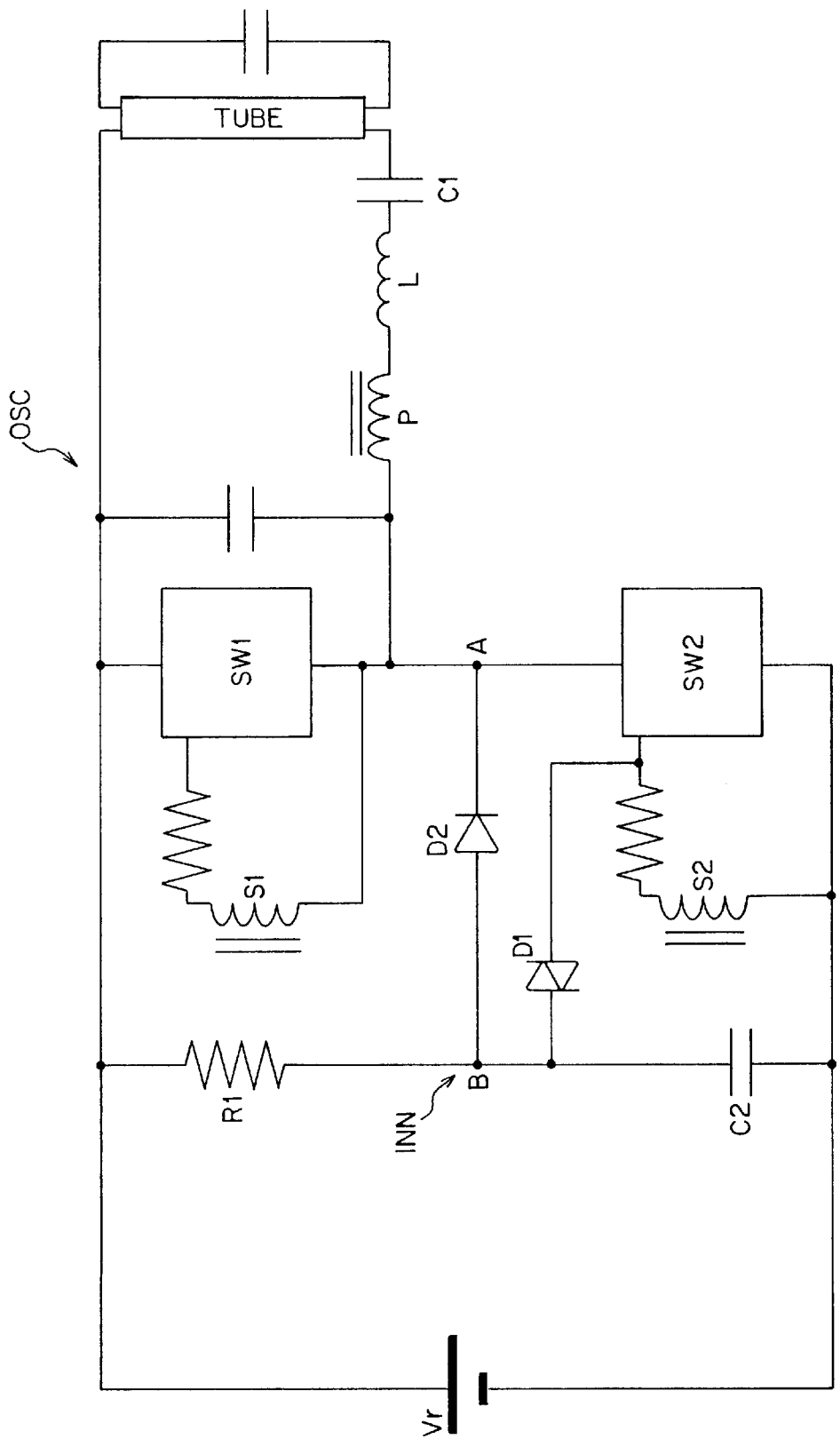
FIG. 3 illustrates a conventional application of a diode of the DIAC type.

Referring to FIG. 2, schematically shown at 1 is an integrated circuit for providing the function of a diode of the DIAC type, the circuit 1 having an input terminal IN and an output terminal OUT.

In particular, with reference to FIG. 2, the circuit 1 comprises a first input transistor T1 of the NPN type, having a first terminal connected to a fixed voltage reference GND, a second terminal, and a control terminal coupled to the input terminal IN of the circuit 1. The control terminal of the first transistor T1 is coupled to the input terminal IN of the circuit 1 through a first circuit element Z1 having a unidirectional current flow. This first unidirectional current flow circuit element Z1 comprises at least a first diode Z1 of the Zener type. In addition, a first resistive element R1 is connected between the control terminal and the first terminal of the first input transistor T1.

Again with reference to FIG. 2, the circuit 1 also includes second T2 and third T3 transistors, both of the PNP type, which are configured into a current mirror. Each transistor, T2 and T3, has a first terminal for coupling to the input terminal IN of the circuit 1, and a second terminal.

In particular, the first terminal of the second transistor T2 is coupled to the input terminal IN of the circuit 1 through a second resistive element R3, while the first terminal of the third transistor T3 is coupled to the input terminal IN of the circuit 1 through a third resistive element R4. The transistors T2 and T3 also have associated control terminals which are connected together and coupled to the second terminal of the first input transistor T1 through a second unidirectional current flow circuit element Z2. This second unidirectional current flow circuit element consists of at least a second diode Z2 of the Zener type.

It should be appreciated that a necessary condition for proper operation of the circuit 1 is that the first diode Z1 should have a higher threshold voltage than the second diode Z2.

The second terminal of the second transistor T2 is connected to the control terminal of the first transistor T1 to form a circuit of the SCR type between the two transistors.

Finally, the circuit 1 includes a fourth output transistor T4 of the NPN type, which is connected with first and second terminals between the output terminal OUT and the input terminal IN of the circuit 1. This fourth output transistor T4 also has a control terminal connected to the second terminal of the third transistor T3. The control terminal of the fourth transistor T4 is also coupled to its own first terminal through a fourth resistive element R2.

The operation of the integrated circuit according to the invention will now be described with particular reference to an initial state wherein the input terminal IN of the circuit 1 is presented an input voltage Vin which is lower than a trigger voltage V1=Vz1+VbeT1 of the circuit 1, Vz1 being a voltage present across the first Zener diode Z1, and VbeT1 being a voltage present between the control terminal and the first terminal of the first input transistor T1.

In this case, the first input transistor T1 is in the 'off' state, and therefore, the second T2, third T3 and fourth T4 transistors are also in their 'off' states. As a result, an impedance of very high value is present between the input terminal IN and the output terminal OUT of the circuit 1.

As the value of the voltage Vin exceeds the value of the trigger voltage V1, the first transistor T1 becomes activated to trigger the SCR circuit that it forms together with the second transistor T2. The conductive state of the second transistor T2 activates the third transistor T3 to conduct, since these are connected into a current mirror. The third transistor T3, by powering the control terminal of the transistor T4, will in turn activate the latter to the conductive state. As the fourth transistor T4 becomes conductive, a current flow is established between the input IN and output OUT terminals of the circuit 1.

This current flow is continued until the voltage Vin drops below a sustaining voltage Vs=VbeT2+Vz2+VceT1, where VbeT2 is a voltage present between the control terminal and the first terminal of the second transistor T2, Vz2 is a voltage present across the second Zener diode Z2, and VceT1 is a voltage present between the first and second terminals of the first transistor T1.

In summary, the circuit of this invention allows of easier integration of a diode of the DIAC type, and affords significant benefits in terms of both cost control and simplified application of the diode.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An integrated circuit said circuit having at least a first input terminal and at least a first output terminal and comprising:
    at least a first input transistor having at least a first terminal connected to a fixed voltage reference, at least a second terminal, and at least one control terminal coupled to the first input terminal of the circuit;
    at least second and third transistors in a current mirror configuration, each having at least a first terminal for coupling to the first input terminal of the circuit, and at least a second terminal, and associated control terminals connected together and coupled to at least the second terminal of the first input transistor, the second terminal of the second transistor being connected to the control terminal of the first transistor; and
    at least a fourth output transistor connected, with first and second terminals, between the first output terminal and the first input terminal of the circuit, said fourth output transistor also having at least one control terminal connected to at least the second terminal of the third transistor wherein said integrated circuit is adapted to perform the function of a diode of the DIAC type.

2. The integrated circuit according to claim 1, wherein the control terminal of the first transistor is coupled to the first input terminal of the circuit through a first unidirectional current flow circuit element.

3. The integrated circuit according to claim 2, wherein the associated control terminals of the second and third transistors are coupled to the second terminal of the first transistor through a second unidirectional current flow circuit element.

4. The integrated circuit according to claim 2, wherein the first unidirectional current flow circuit element comprises at least a first diode of the Zener type.

5. The integrated circuit according to claim 3, wherein the second unidirectional current flow circuit element comprises at least a second diode of the Zener type.

6. The integrated circuit according to claim 4, wherein the first diode has a higher threshold voltage than the second diode.

7. The integrated circuit according to claim 1, wherein the first and fourth transistors are of the NPN type, and the second and third transistors are of the PNP type.

8. The integrated circuit according to claim 7, wherein that the first and second terminals and the control terminal of the first and fourth transistors are emitter, collector and base terminals, respectively.

9. The integrated circuit according to claim 7, wherein the first and second terminals and the control terminal of the second and third transistors are emitter, collector and base terminals, respectively.

10. The integrated circuit according to claim 5, wherein the first diode has a higher threshold voltage than the second diode.

11. An electronic device for driving a fluorescent lamp, comprising:
   a transformer having a primary winding and first and second secondary windings;
   first and second switches connected in series between first and second terminals of a supply voltage generator, the first and second switches being connected in series together through a first intermediate node and in parallel to the first and second secondary windings of the transformer, respectively; and
   a trigger circuit comprising first and second circuit elements connected in series between the first and second terminals of the voltage generator Vr, said first and second circuit elements being connected in series together through a second intermediate node, and said trigger circuit also comprising a diode of the DIAC type connected with first and second terminals between the second intermediate node and the second switch to perform a triggering function for the device oscillations;
   wherein said diode comprises a circuit having at least a first input terminal and at least a first output terminal, said diode further comprising:
   at least a first input transistor having at least a first terminal connected to a fixed voltage reference, at least a second terminal, and at least one control terminal coupled to the first input terminal of the circuit;
   at least second and third transistors in a current mirror configuration, each having at least a first terminal for coupling to the first input terminal of the circuit, and at least a second terminal, and associated control terminals connected together and coupled to at least the second terminal of the first input transistor, the second terminal of the second transistor being connected to the control terminal of the first transistor; and
   at least a fourth output transistor connected, with first and second terminals, between the first output terminal and the first input terminal of the circuit, said fourth output transistor also having at least one control terminal connected to at least the second terminal of the third transistor.

12. The integrated circuit according to claim 11, wherein the control terminal of the first transistor is coupled to the first input terminal of the circuit through a first unidirectional current flow circuit element.

13. The integrated circuit according to claim 12, wherein the associated control terminals of the second and third transistors are coupled to the second terminal of the first transistor through a second unidirectional current flow circuit element.

14. The integrated circuit according to claim 12, wherein the first unidirectional current flow circuit element comprises at least a first diode of the Zener type.

15. The integrated circuit according to claim 13, wherein the second unidirectional current flow circuit element comprises at least a second diode of the Zener type.

16. The integrated circuit according to claim 14, wherein the first diode has a higher threshold voltage than the second diode.

17. The integrated circuit according to claim 11, wherein the first and fourth transistors are of the NPN type, and the second and third transistors are of the PNP type.

18. The integrated circuit according to claim 17, wherein that the first and second terminals and the control terminal of the first and fourth transistors are emitter, collector and base terminals, respectively.

19. The integrated circuit according to claim 17, wherein the first and second terminals and the control terminal of the second and third transistors are emitter, collector and base terminals, respectively.

20. The integrated circuit according to claim 15, wherein the first diode has a higher threshold voltage than the second diode.

21. An integrated circuit comprising:
   first switch means having a first terminal connected to a voltage reference, a second terminal and a third terminal coupled to an input terminal of said circuit through a first diode and to its own first terminal through a first resistor;
   second switch means having a first terminal coupled to said input terminal, a second terminal connected to said third terminal of said first switch means and a third terminal coupled to said second terminal of said first switch means;
   third switch means having a first terminal coupled to said input terminal, a second terminal and a third terminal connected to said third terminal of said second switch means; and
   fourth switch means having a first terminal connected to an output terminal of said circuit, a second terminal connected to said input terminal and a third terminal connected to said second terminal of said third switch means wherein said integrated circuit is adapted to perform the function of a diode of the DIAC type.

22. The circuit of claim 21, wherein said first terminals of said second and third switch means are coupled to said input terminal through second and third resistors, respectively and said second terminal of said third switch means is connected to said output terminal through a fourth resistor.

23. The circuit of claim 22, wherein said third terminals of said second and third switch means are coupled to said second terminal of said first switch means through a second diode.

24. The circuit of claim 23, wherein first and fourth switch means comprise NPN bipolar transistors and said second and third switch means comprise PNP bipolar transistors.

25. The circuit of claim 24, wherein said first terminal of said first, second, third and fourth switch means is an emitter, said second terminal of said first, second, third and fourth switch means is a collector and said third terminal of said first, second, third and fourth switch means is a base.

26. The circuit of claim 25, wherein said first and second diodes are Zener diodes.

27. The circuit of claim 26, wherein, when an input voltage Vin, applied at the input terminal, is less than a trigger voltage, V1, where V1=Vz1+VbeT1, in which Vz1 is a voltage drop across said first diode and VbeT1 is the voltage drop between the base and emitter terminals of said first switch means, said circuit is in a high impedance state.

28. The circuit of claim 27, wherein, when said input voltage Vin exceeds the trigger voltage V1, current flows between said input and output terminals.

29. The circuit of claim 28, wherein, once said input voltage, Vin, drops below a sustaining voltage Vs, where Vs=VbeT2+Vz2+VceT1, in which VbeT2 is a voltage drop between the base and emitter of said second switch means, Vz2 is a voltage drop across said second diode and VceT1 is a voltage drop between the collector and emitter of said first switch means, said circuit enters said high impedance state.

30. The circuit of claim 23, wherein said first diode has a higher threshold voltage than said second diode.

* * * * *